July 12, 1960 N. F. MOODY ET AL 2,945,134

BISTABLE SEMICONDUCTOR CIRCUIT

Filed Sept. 14, 1956 2 Sheets-Sheet 1

INVENTOR
NORMAN F. MOODY &
CHARLES D. FLORIDA.
By Smart & Biggar
ATTORNEYS

INVENTORS
NORMAN F. MOODY &
CHARLES D. FLORIDA.
BY- Smart & Biggar
ATTORNEYS 2,945,134

BISTABLE SEMICONDUCTOR CIRCUIT

Norman F. Moody, Ottawa, Ontario, and Charles D. Florida, Merivale Gardens, Ontario, Canada; said Florida assignor to Her Majesty the Queen in right of Canada Filed Sept. 14, 1956, Ser. No. 610,002

21 Claims. (Cl. 307—88.5)

Figure 3:
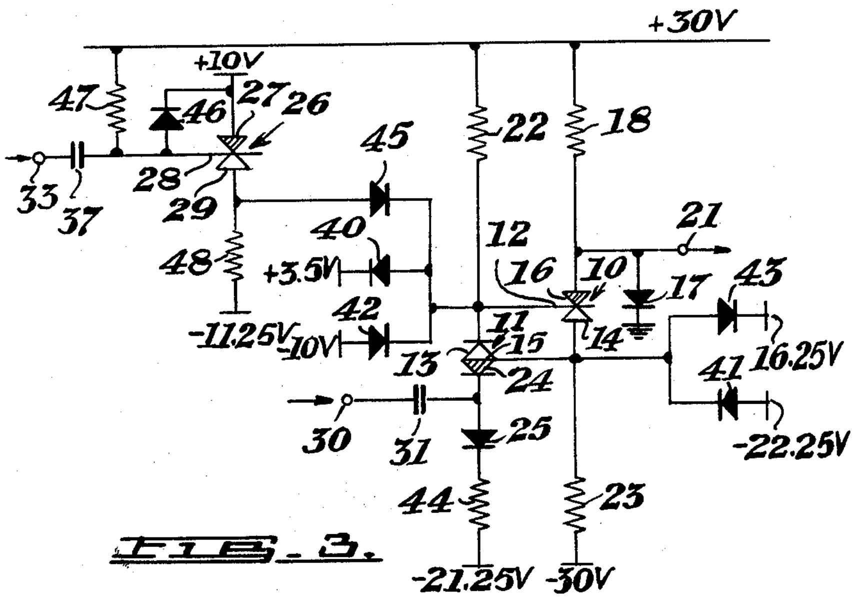

The invention relates to the circuits of two-state apparatus using junction transistors and, although the invention has applications in various fields which require such circuits, reference will be made to its use in the digital computer field.

Digital computer design may be based on the use of two-state circuits interconnected by passive routing circuits. The two-state circuits are active or power injecting devices while the routing circuits comprise diodes, resistances and condensers which simply interconnect the two-state circuits under command of instructions (machine logic). The two-state circuits may be tripped from one state to another by impulses so that attention must be given to the wavefronts produced by the two-state circuits as they make a transition from one state to the other. These wavefronts (pulse edges) must be sharp and must be capable of supplying considerable surge current because the logic may call upon one two-state circuit to feed several similar circuits. The transmission of a wavefront from a two-state circuit to others which are to be triggered may be done via small condensers (because only momentary impulses are required for the purpose), but in general the routing circuits will have direct current (D.C.) connections to the two-state circuits and will therefore absorb maintained currents of considerable value from the two-state circuits. In order that the two-state circuits be readily adaptable to various uses they should have two separate input terminals, each excited with same polarity of drive pulse, one to set the circuit to the one state and the other to reset the circuit to the alternative state. In some cases it is also of advantage to have a pair of output waveforms.

A two-state apparatus which meets these requirements is provided by the invention and comprises a junction type semiconductor unit having an effective emitter electrode, an effective first base electrode, an effective second base electrode, and an effective collector electrode; a first clamping means adapted to maintain the semiconductor unit in a cut-off state; a second clamping means adapted to maintain the semiconductor unit in a state of conduction; the first clamping means include means adapted to clamp the effective collector electrode at a first predetermined potential when the semiconductor unit is in a state of non-conduction; the second clamping means including means adapted to clamp the effective collector electrode at a second predetermined potential when the semiconductor unit is in a state of conduction; an output connection taken from the effective collector electrode; and an input connection taken from at least one of the effective electrodes of the semiconductor unit.

According to one embodiment of the invention the semiconductor unit comprises a pair of complementary junction type transistors; each of the transistors including an emitter, a base, and a collector; the collector of each transistor being connected to the base of the other transistor; whereby the emitter of one transistor forms the effective emitter electrode for said semiconductor unit, and the emitter of the other transistor forms the effective collector electrode for said semiconductor unit.

An important advantage of a two-state circuit according to the invention is its simplicity. This is particularly important in computers which require a large number of two-state circuits. The invention permits greater reliability at low cost while giving good performance characteristics. Short resolving times are obtained and surge current as well as high maintained D.C. current can be accepted at the output of the two-state circuit. Circuits according to the invention give substantially constant outputs irrespective of external loads, and the input and output levels are compatible for gating circuits and coupling between two-state circuits.

Figures 6, 7, 8:
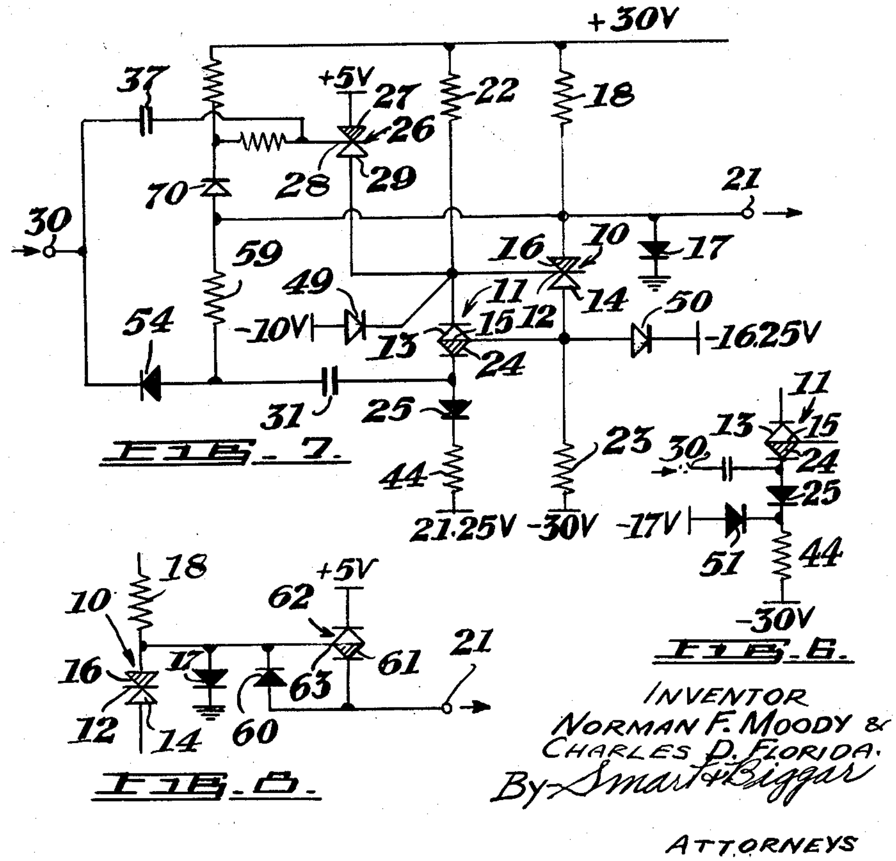
Figure 1:
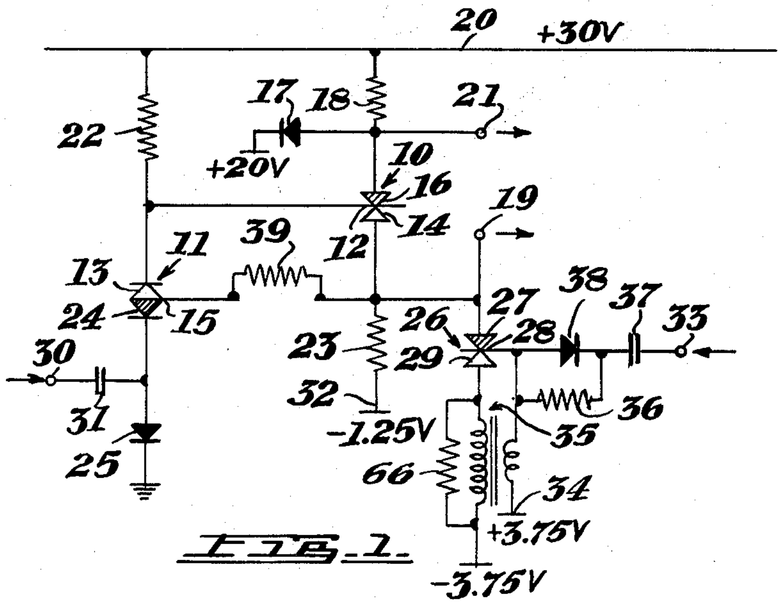
Figures 2, 9:
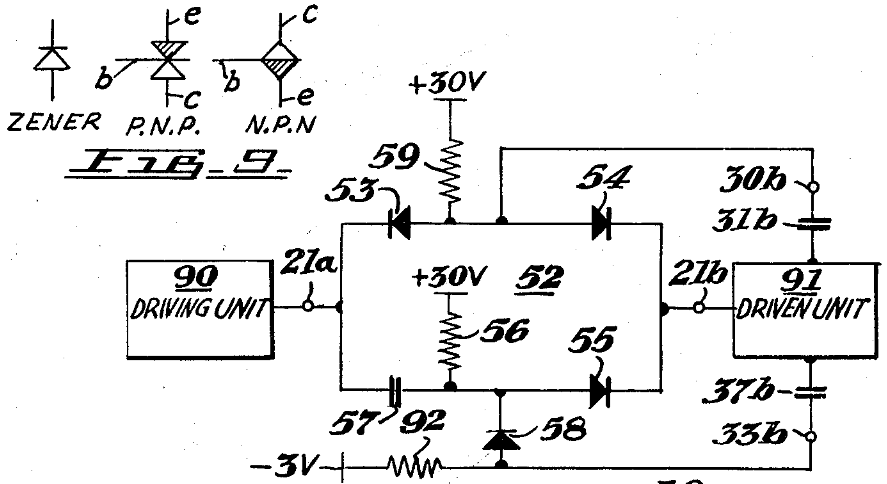
Figure 5:
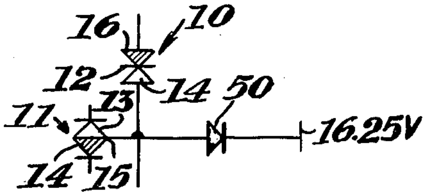
Figure 4:
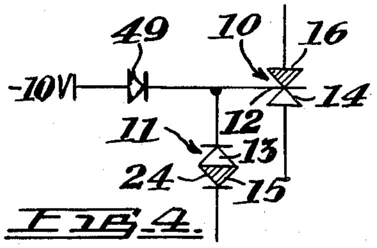

The invention will be described further with reference to the accompanying drawings, in which:

Figure 1 is a schematic diagram illustrating a two-state apparatus in accordance with the invention, Figure 2 is a schematic diagram illustrating a routing circuit interconnecting two two-state units, Figure 3 is a schematic circuit diagram illustrating a modified two-state apparatus, Figure 4 is a schematic drawing illustrating a modification for the circuit shown in Figure 3, Figure 5 is a schematic diagram illustrating a modification for the circuit illustrated in Figure 3, Figure 6 is a schematic diagram illustrating a modification for the circuit illustrated in Figure 3, Figure 7 is a schematic diagram illustrating a two-state apparatus and a modified routing circuit, Figure 8 is a schematic diagram illustrating a modification for the circuit illustrated in Figures 3 and 7, and Figure 9 shows the symbols used in the drawings in this application for diodes and transistors.

A two-state apparatus including two complementary junction type transistors interconnected to form a single n-p-n-p semiconductor structure is illustrated in Figure 1. The n-p-n-p semiconductor structure is formed by connecting the base 12 of transistor 10 to the collector 13 of transistor 11, and by connecting the collector 14 of the transistor 10 to the base 15 of the transistor 11. The effective emitter electrode of the semiconductor structure is the emitter 24 of the transistor 11, the effective first base electrode consists of the collector 14 of the transistor 10 and the base 15 of the transistor 11, the effective second base electrode consists of the base 12 of the transistor 10 and the collector 13 of the transistor 11, and the effective collector electrode is the emitter 16 of the transistor 10.

When the n-p-n-p semiconductor structure is in a state of non-conduction, the emitter 16 of the transistor 10 is clamped at +20 volts since an electron current will flow from the +20 volts power supply through diode 17 and the resistor 18 to the +30 volts power supply. Consequently the output terminal 21 of the two-state apparatus is clamped at +20 volts when the n-p-n-p structure is not conducting. The base 12 of the transistor 10 is held at approximately +30 volts when the n-p-n-p structure is not conducting, because only the cut-off collector currents of the two transistors 10 and 11 flow through resistor 22. Consequently a cut-off bias of approximately 10 volts exists between the base 12 and the emitter 16 of transistor 10. The base 15 of the transistor 11 is clamped at approximately −1.25 volts since in this cut-off state practically no current can flow through the resistor 23, and the emitter 24 of the transistor 11 cannot rise above 0 volts because of the diode 25 which is connected between the emitter 24 and ground. Thus a cut-off voltage of approximately −1.25 volts appears between the base 15 and the emitter 24 of the transistor 11. The transistor 26 is maintained in a cut-off state because its emitter 27 is held at approximately −1.25 volts and its base 28 is held at +3.75 volts.

The n-p-n-p structure can be switched from the state of non-conduction to the state of conduction by applying a positive input pulse to the input terminal 30. When the leading edge of this positive input pulse appears on the input terminal 30 electrons flow from ground through the diode 25 to one side of the capacitor 31. When the lagging edge of this pulse arrives at the input terminal 30, these electrons cannot be forced back through diode 25 and consequently some of these electrons are forced through the emitter 24 to the base 15 of transistor 11. This flow of base current causes a current to flow through transistor 11. The conduction of transistor 11 provides a current which flows through the resistor 22 and thus the potential on the base 12 of the transistor 10 is reduced below the potential of the emitter 16 of the transistor 10, and consequently transistor 10 starts to conduct current. When the transistor 10 conducts, electrons flow from the −1.25 volt power supply to the +30 volt power supply by way of the resistor 23, the transistor 10 and the resistor 18. This flow of current tends to raise the potential on the base 15 of the transistor 11, and consequently the transistor 11 conducts a greater amount of current. In this manner a regenerative condition is set up which causes the n-p-n-p structure to switch to the on state.

The time required to switch the n-p-n-p structure from a state of conduction to a state of non-conduction will be reduced if the transistor 11 is prevented from reaching a "bottomed state" (where the term "bottomed state" can be defined as that state where the transistor is operating below the knee on its collector current/collector voltage characteristic curve), as is disclosed hereinafter. This condition will exist if the two transistors are chosen so that the transistor 11 bottoms at a lower maximum voltage than the transistor 10 because the transistor 10 will then be the limiting factor. If the transistors 10 and 11 have similar characteristics, this condition can be insured by connecting a small series resistor 39 or a diode (not shown) between the collector 14 of the transistor 10 and the base 15 of the transistor 11.

When the circuit is conducting in the manner described above a virtual short circuit exists between the emitter 24 of the transistor 11 and the emitter 16 of the transistor 10. Consequently the emitter 16 of the transistor 10 falls to substantially zero volts, and this will then be the potential appearing at the output terminal 21.

The n-p-n-p structure can be switched from the state of conduction to the state of non-conduction by applying a positive input pulse to the second input terminal 33. When the leading edge of this positive pulse appears at the input terminal 33 electrons flow from the +3.75 volt power supply through the secondary of the transformer 35, and the resistor 36, to one side of the capacitor 37. When the lagging edge of this positive pulse appears at the input terminal 33 part of the charge stored in the condenser 37 flows through the diode 38 to the base 28 of transistor 26 and permits the transistor 26 to conduct current. The transformer 35 is connected in the collector and base circuits of the transistor 26 in the conventional manner of a blocking oscillator, and a resistor 66 is connnected across the transformer to prevent ringing. Once the transistor 26 commences to conduct, it will rapidly reach a bottomed state because of the blocking oscillator action. The heavy conduction of the transistor 26 rapidly reduces the voltage appearing on the base 15 of the transistor 11, thereby providing a cut-off bias between the base 15 and the emitter 24 of the transistor 11, and since this transistor was not in a bottomed state it will cease to conduct in a very short period of time. When the transistor 11 ceases to conduct the potential of the base 12 of transistor 10 rises to +30 volts and consequently a cut-off potential appears between the base 15 and the emitter 24 of the transistor 11 with the result that this transistor will rapidly cease to conduct. In this manner the n-p-n-p structure returns to the cut-off state, with the output terminal 21 being clamped at +20 volts by the action of the diode 17 and the resistor 18.

The transistor 26 would cut itself off in due course of time (like a conventional blocking oscillator) if it were not that in the present case relaxation sets in because of lack of current. In the initial stages of turn-off the emitter of transistor 26 can withdraw a heavy current from the n-p-n-p structure. Once bottoming in the structure has ceased the available emitter current of the transistor 26 must decay to that which can be supplied by the resistor 23 from the −1.25 volts power supply. The latter current is insufficient to maintain the blocking oscillator action and the current ceases. The n-p-n-p structure can be expected to reach its cut-off state in about 2 microseconds and the carriers of transistor 26 can be cleared in a further time of approximately two microseconds. Thus a resolving time of approximately four or five microseconds is typical for this circuit.

The output signals from the circuit illustrated in Figure 1 may be used to control other circuits as discussed below, and therefore, the amount of current which is available is important, particularly when the circuit switches from one state to the other state. In the on state the current available is the emitter to base and emitter to collector currents of transistor 10 and because this transistor is conducting in a bottomed state this current can be relatively high without exceeding the safe transistor power dissipation. In the cut-off state the only current that is available at the output terminal 21 is the current that is flowing from diode 17 to resistor 18. When the n-p-n-p structure is turned on the charge stored in capacitor 31 ensures a surge of current which will be quite high. When the n-p-n-p structure is being turned off the transistor 26 rapidly reaches a bottomed state, and therefore, a heavy surge of current is available at output terminal 19.

The following discussion shows how two of the basic two-state apparatus illustrated in Figure 1 can be interconnected by means of a routing circuit 52 as illustrated in Figure 2 to form a scaler or counter. Referring now to Figure 2 one two-state unit represented by block 90 is called the driving unit and the second two-state unit represented by block 91 is called the driven unit. The driving and driven units 90 and 91 are both identical to the apparatus illustrated in Figure 1 and the reference numerals that include the suffix "*a*" will refer to the driving unit whereas the reference numerals that include the suffix "*b*" will refer to the driven unit.

It will be assumed that the driving unit 90 is switched periodically from one state to the other state thus providing a square wave output at terminal 21*a*. The routing circuit 52 will switch the driven unit 91 from one state to the other state on the occurrence of each alternative negative edge of the square wave form appearing at terminal 21*a* as hereinafter discussed, so that the output wave form appearing at terminal 21*b* will be a square wave whose frequency is one-half the frequency of the square wave appearing at terminal 21*a*.

When the driving and driven units 90 and 91 are both in a state of conduction so that terminals 21*a* and 21*b* are at zero volts (as explained above with reference to Figure 1) then the junction between diodes 53 and 54 will be at zero volts since both of these diodes conduct, and the junction between diode 55 and resistor 56 will be at zero volts potential because the diode 55 will conduct electron current towards resistor 56. When the driving unit 90 turns off so that terminal 21*a* rises to +20 volts the junction of diodes 53 and 54 will not be disturbed because diode 54 can still conduct. The junction of resistor 56 and capacitor 57 was previously restrained at zero volts by diode 55 and the condenser 57 was uncharged. The rise of terminal 21*a* charges condenser 57 to +20 volts.

When the driving unit 90 is turned on, the terminal 21*a* falls again to zero volts. The junction of the resistor 56 and the condenser 57 is momentarily depressed to −20 volts with the result that the diode 58 conducts and an impulse is passed to the condenser 37*b* of the driven unit 91. This impulse cuts off the driven unit and terminal 21*b* rises to +20 volts. The potential of the junction between the diodes 53 and 54 was unaltered by by the fall of potential of the terminal 21*a* since this merely brought the diode 53 into conduction again.

With the terminal 21*b* at +20 volts the junction of the capacitor 31*b* and the resistor 59 is still held at zero volts, this time by the conduction of diode 53. When the driving unit 90 is again cut-off so that the terminal 21*a* rises again to +20 volts neither the diode 53 nor the diode 54 will conduct until the capacitor 31*b* is charged to 20 volts by current flowing through the resistor 59. By referring to Figure 1 it can be seen that the positive potential at the input terminal 30 causes electrons to flow through the diode 25 and this primes the circuit for firing as hereinbefore described.

With terminal 21*b* at +20 volts the resistor 56 can charge the condenser 57 so that the junction of the resistor 56 and the condenser 57 rises to +20 volts, and is maintained at that potential by the diode 55.

The cycle is completed when the driving unit 90 switches on again causing the terminal 21*a* to fall to zero volts. The junction between diodes 53 and 54 which had been at +20 volts is now pulled by the diode 53 to zero volts and a negative impulse is transmitted by way of the condenser 31*b* to the driven unit thus turning on the driven structure 91.

At the instant when the terminal 21*a* last fell to zero volts the junction between the resistor 56 and the condenser 57 which had been at +20 volts, falls to zero volts. No impulse is passed to condenser 37*b*, however, because the diode 58 is biased off by the −3 volt power supply connected to the diode 58 through the resistor 92.

The output signal from the driving and driven units 90 and 91 are called upon to charge and discharge condensers of the routing circuit 52 and thus it is seen that it is of advantage to have a large amount of current available at terminals 21*a* and 21*b* and particularly so when the units are switching from one state to the other state as hereinbefore stated. A driving unit, such as the driving unit 90 of Figure 2, can be used to control several driven units, such as the driven unit 91 of Figure 2, and the basic two-state apparatus illustrated in Figure 1 is suited for use as the driving unit because it can supply large surges of current.

The resolving time of the two-state apparatus illustrated in Figure 1 can be improved by preventing the transistor 10 from reaching a bottomed state. A circuit in which this is done is illustrated in Figure 3. The transistors 10 and 11 are interconnected in the same way as they are in Figure 1 and thus provide an effective four electrode semiconductor structure which in this case is a n-p-n-p structure. In this embodiment the diode 17 is returned to ground rather than to a positive potential so that in the off state electrons flow from ground through diode 17 and resistor 18 to the +30 volt power supply. Consequently the output terminal 21 and the emitter 16 of the transistor 10 is clamped at ground potential when the circuit is in the off state. It will be shown below that in the on state the output terminal 21 is clamped at −10 volts.

When the n-p-n-p structure is in a cut-off state the base 12 of the transistor 10 attempts to rise to +30 volts but is clamped at +3.5 volts by the diode 40 connected to the +3.5 volt power supply. The base 15 of the transistor 11 attempts to fall to −30 volts but is maintained at −22.25 volts by the diode 41 connected to the −22.25 volt power supply. The emitter 24 of the transistor 11 is held at approximately −21.25 volts by the diode 25, the resistor 44, and the −21.25 volt power supply. In this manner a cut-off bias of one volt is maintained between the base 15 and the emitter 24 of the transistor 11, and a cut-off bias of 3.5 volts is maintained between the base 12 and the emitter 16 of the transistor 10.

Upon the arrival of an input signal at the terminal 30 the n-p-n-p structure is forced into conduction in the same manner as the n-p-n-p structure illustrated in Figure 1. When the transistor 11 commences conduction its collector 13 and consequently the base 12 of the transistor 10 drops in potential, and is clamped at −10 volts by the diode 42 connected to the −10 volt power supply. Consequently a forward bias is maintained between the base 12 and the emitter 16 of the transistor 10 which maintains this transistor in a state of conduction. When transistor 10 conducts its collector 14, and consequently the base 15 of the transistor 11, rises in potential and is clamped at −16.25 volts by the diode 43 connected to the −16.25 volt power supply. In this manner a forward bias is maintained for both transistors 10 and 11.

If the transistors 10 and 11 were permitted to reach a bottomed state, then the potentials of the base 12, of the transistor 10, and the base 15, of the transistor 11, would be within half a volt of each other. The transistors are prevented from bottoming because a difference in potential of 6.25 volts is forced to exist between the base 12 and the base 15.

When diodes, such as the diodes 42 and 43, are connected to the bases of transistors, in the above manner, it is necessary that resistors be included in both emitters to limit the current of the structure to a finite value. Resistors 18 and 44 serve this purpose. The potential difference between the base 15 and the emitter 24, of the transistor 11, is negligible and therefore the current injected at the emitter 24 can be calculated (assuming resistor 44 is 680 ohms), as $$\frac{21.25\ (\text{volts})-16.25\ (\text{volts})}{680\ (\text{ohms})}$$

giving 7 ma. of current injected at emitter 24. When the circuit is turned on, the charge of the capacitor 31 is also injected at the emitter 24 of the transistor 11 and thus provides a surge of current that is greatly in excess of 7 ma. Consequently the current available at the base 12 of transistor 10 is greatly increased, with the result that a considerable surge of current can be delivered to the output terminal 21 when the circuit is turned on. When the output signal from the output terminal 21 is used to control several driven units in the manner discussed with reference to Figure 2, it is of advantage to have this surge of current available.

When the diode 42 is conducting the base 12 of the transistor 10 is held at a fixed potential and the transistor 10 acts as an emitter follower to the combined load of the resistor 18 and an external load connected to the output terminal 21. This emitter follower action exists as long as sufficient base current is available for the transistor 10. If the $\alpha$ of transistor 11 is 0.95 then, because the current flowing through the emitter 24 is 7 ma. approximately 6.65 ma. leaves the collector 13. Approximately 0.65 ma. of this current is diverted through the resistor 22 and the balance is available to flow to the base 12 of transistor 10 or to the diode 42. In the absence of current flowing from the output termial 21 to an external load and to the resistor 18, the base 12 would draw no current and all of the current leaving the collector 13 would flow into the diode 42 except the 0.65 ma. diverted through the resistor 22. The maximum current which can be drawn by the external load and the resistor 18 is $$\frac{6\ \text{ma.}}{1-\alpha}$$

where $\alpha$ is the $\alpha$ of transistor 10. Thus it is seen that the total steady state current which can be drawn by the load and resistor 18 is 120 ma. when the transistors 10 and 11 each has an $\alpha$ of 0.95.

Owing to the finite alpha cut-off frequency of transistors the output impedance of the transistor 10 presents a much higher impedance to alternating current loads than to direct current loads connected to the output terminal 21. It will suffice to say that when the direct current drawn by the load is considerably less than the limit value (that is a value of load which draws in the above case considerably less than 120 ma.) the excess current flowing through the diode 42, which is available to the transistor on demand, allows the output terminal 21 to make a fast recovery from any displacements resulting from transient conditions. To a first approximation the time required to make this recovery is inversely proportional to the extra current available to the transistor 10.

As long as the transistor 10 is conducting the potential difference between its base and emitter cannot exceed a few tenths of a volt. The potential of the output terminal 21 therefore must be very nearly that of the bias on the diode 42, in this example −10 volts, while the device is in the on state.

The collector current of the transistor 10, which is proportional to the load current drawn through the output terminal 21, is absorbed by the diode 43 and the resistor 23 so that the base 15 of the transistor 11 is not forced to absorb more than the usual fraction $(1-\alpha)I_E$ where $\alpha$ relates to transistor 11 and $I_E$ is the current flowing in the emitter 24.

The emitter 27 of the transistor 26 is connected directly to the +10 volts power supply, and a cut-off bias is maintained between the base 28 and the emitter 27 by means of the diode 46 which normally passes electron current to the resistor 47. The collector 29 which is held at −11.25 volts by the resistor 48 and the −11.25 volt power supply is isolated from the base 12 of transistor 10 by the diode 45 whether the n-p-n-p structure be in the on or off state.

The n-p-n-p structure is switched from the on to the off state by applying a signal to the input terminal 33 which causes the base 28 of the transistor 26 momentarily to become negative with respect to the emitter 27. Consequently the transistor 26 commences to conduct and the potential of its collector 29 rises towards +10 volts but is limited at +3.5 volts by the diodes 40 and 45. In this condition the potential of the base 12 of the transistor 10 is held above the potential of the emitter 16. In this manner a cut-off voltage of 3.5 volts is applied to the transistor 10. This transistor was not in a bottomed state so its collector current will fall rapidly. The value of the resistor 23 is chosen to absorb a considerable amount of the collector current of the transistor 10 (approximately 5 ma.), and it is only necessary for this collector current to decay to this value for the excitation of the base 15 of the transistor 11 to cease. If the resistor 23 is chosen to draw approximately one-tenth the total load current placed on the transistor 10 the base current for the transistor 11 will decay to zero in a period of time that is approximately $$\frac{3}{\omega_{\alpha co}}$$

where $\omega_{\alpha co}$ relates to the transistor 10. A typical value for the time required to reduce the base current of the transistor 11 to zero is approximately 0.1 to 0.2 microsecond, and it is only necessary that the transistor 26 maintain conduction for a time slightly in excess of this.

After receipt of the input pulse at the terminal 33, the base 28 of the transistor 26 may remain conductive for several microseconds and the n-p-n-p structure will not be able to be turned on again until the transistor 26 has ceased conduction. This process may be greatly hastened by applying a subsequent positive impulse to the base 28 of the transistor 26, which will enable the current carriers of the transistor 26 to be cleared in less than one microsecond. When the $\alpha$ cut-off frequency of the transistors are all over 3 megacycles the circuit will readily make transitions at one microsecond intervals.

If the transistor 26 has a low collector to base capacity, the diode 45, the resistor 48 and the −11.25 volt power supply may be omitted, and the collector 29 of the transistor 26 may be connected direct to the base 12 of the transistor 10. If this capacity is not low, these components are necessary because otherwise the sharp firing edge of the waveform appearing at the base 12 of the transistor 10 when the structure is turned on and thus at the collector 29 will find its way to the base 28 of the transistor 26 because of the collector to base capacity. This will cause momentary conduction of the transistor 26 which in turn would delay the leading edge of this waveform. When the diode 45 is inserted a reverse potential appears across it at all times when transistor 26 is non-conducting because resistor 48 is returned to −11.25 volts while the base 12 of the transistor 10 must at all times be within the limits +3.5 volts and −10 volts. Consequently the fall of potential at the base 12 of transistor 10, when the device switches to the on state, is not transmitted to transistor 26.

The two diodes 40, 42 can be replaced by a special diode known as a Zener diode. A Zener diode is a special diode which has normal forward characteristics but has a predetermined break-down voltage in the reverse direction. The two diodes 40 and 42 can be replaced by a Zener diode 49 as shown in Figure 4. If the base 12 of the transistor 10 attempts to fall below −10 volts, the Zener diode 49 will conduct and clamp the base 12 at −10 volts. The particular Zener diode used has a break-down voltage of 13.5 volts and consequently when the base 12 of the transistor 10 attempts to rise towards +30 volts, the Zener diode will break down and clamp the base 12 at +3.5 volts. Thus it is seen that the Zener diode 49 performs the same function as the two diodes 40 and 42 of Figure 3.

The two diodes 41 and 43 of Figure 3 may also be replaced by a Zener diode 50 as illustrated in Figure 5 of the drawings. In this case the Zener diode 50 has a break-down voltage of 6 volts and is connected between the base 15 of the transistor 11 and a −16.25 volt power supply. If the base 15 of the transistor 11 attempts to rise in voltage it will be limited to −16.25 volts because of conduction of the Zener diode 50 in the forward direction and when the base 15 of the transistor 11 attempts to fall to −30 volts the Zener diode 50 will break down and clamp the base 15 at −22.25 volts.

The circuit of Figure 3 may also be altered as illustrated in Figure 6. The circuit of Figure 6 has the advantage that it provides a nearly constant current at all times in the resistor 44. This resistor 44 is of a higher value than the equivalent resistor of Figure 3 and is returned to −30 volts rather than −21.25 volts. When the n-p-n-p structure is in a cut-off state electron current will flow through the resistor 44 and the diode 51 to the −17 volt power supply and when the n-p-n-p structure is in a state of conduction approximately the same current will flow through the resistor 44 and diode 25 to the emitter 24 of the transistor 11. This facilitates the use of the structure in certain types of circuits not herein described.

In the circuit shown in Figure 3 the edge of the output waveform associated with the turn-off of the n-p-n-p unit is unable to deliver heavy surges of currents to an external load. This is because most of the available turn-off current is provided by resistor 18. A modification of the circuit of Figure 3 is illustrated in Figure 8. This modification provides a considerable surge of current at the turn-off time of the n-p-n-p structure. The modified circuit employs an additional diode 60 and a transistor 62 connected as shown in Figure 8. When the n-p-n-p structure is in a state of conduction, so that the emitter 16 of the transistor 10 is negative with respect to ground, the transistor 62 remains in a cut-off state because the charging current for capacitive external D.C. load current flows through diode 60 thereby producing a small voltage drop across the diode and consequently a reverse voltage appears between emitter and base of transistor 62. When the n-p-n-p structure turns off and the emitter 16 of the transistor 10 commences to return to zero potential, the base 63 becomes positive with respect to the emitter 61 of the transistor 62, because of the polarity of the diode 60. Consequently the transistor 62 commences to conduct base current, and this of course causes a larger collector current to flow through the transistor 62 from the +5 volt power supply. In this manner a surge of current is supplied and will continue until the capacitive load is discharged.

The routing circuit illustrated in Figure 2 may be connected between two circuits of the type illustrated in Figure 3 to form a scaler. It is only necessary that the bias voltages of the routing circuit be altered in view of the new output levels. When transistors of high alpha cut-off frequency are employed, the condensers 37*b* and 30*b* and resistors 56 and 59 (Figure 2) may with advantage be reduced in value to take advantage of the resolving time of which the structure of Figure 3 is capable.

A two-state apparatus including a modified routing circuit is illustrated in Figure 7. The two transistors 10 and 11 are interconnected to form an n-p-n-p structure in the same manner as they were in Figure 3 and the Zener diodes 50 and 49 are employed in the manner shown in Figures 4 and 5. The n-p-n-p structure functions in the same manner as the equivalent structure discussed with reference to Figure 3.

It will be remembered that in a scaler, transistor 26 (Figure 7) is to be actuated by an input pulse only when the n-p-n-p structure is in the on state and the emitter 24 of the transistor 11 is to be impulsed only when the n-p-n-p structure is in the off state.

The branch of the routing circuit which consists of the diode 54, capacitor 31 and resistor 59 works in the following manner: when the driven stage is in the off state and the potential at the input point 30 rises from −10 to zero volts diode 54 is rendered non-conducting and current flows through resistor 59 to charge condenser 31. This is possible because the potential of the n-p-n-p output 21 is zero volts while the initial potential at the junction of resistor 59 and capacitor 31 is −10 volts. When the input point 30 is returned again to −10 volts the release of the charge stored on the condenser 31 causes current to flow in the base to emitter portion of transistor 11 which causes the n-p-n-p structure to turn on as described previously. When the driven stage is in the on state and the input point 30 rises from −10 volts to zero volts, however, no current can flow through the resistor 59 because the potential at the output point 21 of the n-p-n-p structure and the initial potential at the junction of resistor 59 and capacitor 31 are the same. The condenser therefore cannot change and consequently when the input point 30 subsequently returns to −10 volts no change of current occurs in the circuit formed by transistor 11, condenser 31 and diode 54.

The operation of the modified routing circuit of Figure 7 at turn-off differs considerably from the operation of the routing circuit of Figure 2 and relies on the base 28 of transistor 26 being displaced in D.C. potential by means of the voltage appearing at the output terminal 21. When the n-p-n-p structure is in the off state and the output potential is zero the base 28 of the transistor 26 will attempt to rise to +30 volts potential but will be limited to 19 volts by the breakdown voltage of the Zener diode 70. Consequently a cut-off bias of 14 volts appears between the base 28 and the emitter 27. In this condition transistor 26 is biased off so heavily that any normal input to the base 28 by way of the capacitor 37 is unable to overcome the cut-off bias and is, therefore, ignored by the transistor 26. When the n-p-n-p structure is in a state of conduction the output terminal 21 falls to −10 volts with the result that the D.C. potential appearing on the base 28 falls to +9 volts. In this condition a 4 volt cut-off is applied between the base 28 and the emitter 27 of the transistor 26 and this bias can be readily overcome by a normal negative input signal (in the order of 10 volts) at terminal 30.

All of the circuits described in this disclosure can of course be modified to employ complementary transistors, that is each n-p-n transistor can be replaced by a p-n-p transistor and each p-n-p transistor can be replaced by a n-p-n transistor. A p-n-p-n structure may be substituted for the n-p-n-p structure in each of Figures 1, 2, 3 and 7. When this is done the polarity of the appropriate power supplies and biasing means must be reversed and the circuit resulting will operate in the same manner as described herein but will provide output signals of opposite polarity to the output signals of the circuits illustrated in the drawings.

What we claim as our invention is:

1. A two-state apparatus having at least one output connection and at least one input connection, said apparatus comprising, a junction type semiconductor unit having an effective emitter electrode, an effective first base electrode, an effective second base electrode, and an effective collector electrode; a first clamping means adapted to maintain the semiconductor unit in a cut-off state; a second clamping means adapted to maintain the semiconductor unit in a state of conduction and including means adapted to prevent the semiconductor unit from reaching a bottomed state; means adapted to clamp said effective collector electrode at a first predetermined potential when the semiconductor is in a state of non-conduction; means adapted to clamp said effective collector electrode at a second predetermined potential when the semiconductor unit is in a state of conduction; an output connection taken from said effective collector electrode; and an input connection taken from at least one of the effective electrodes of the semiconductor unit; for switching the semiconductor unit from one said state to the other in response to an input signal.

2. An apparatus as claimed in claim 1, in which the semiconductor unit comprises a pair of complementary junction transistors; each of the transistors including an emitter, a base, and a collector; the collector of each transistor being connected to the base of the other transistor; whereby the emitter of one transistor forms the effective emitter electrode for said semiconductor unit, and the emitter of the other transistor forms the effective collector electrode for said semiconductor unit.

3. An apparatus as claimed in claim 1, in which an input connection is taken from said effective emitter electrode through a series capacitor, and a diode is connected between a source of predetermined potential and said effective emitter electrode to pass current when the semiconductor unit is in the state of conduction.

4. An apparatus as claimed in claim 1, in which a blocking oscillator circuit is connected to one of said effective base electrodes and is adapted to switch the two-state apparatus from the state of conduction to the state of non-conduction in response to an input signal to the blocking oscillator circuit.

5. An apparatus as claimed in claim 1, in which an input connection is taken from said effective emitter electrode through a series capacitor, a diode is connected between a source of predetermined potential and said effective emitter electrode to pass current when the semiconductor unit is in the state of conduction, and a blocking oscillator circuit is connected to one of said effective base electrodes and is adapted to switch the two-state apparatus from a state of conduction to a state of non-conduction in response to an input signal to the blocking oscillator circuit.

6. An apparatus as claimed in claim 1, in which a blocking oscillator circuit is connected to one of said effective base electrodes and is adapted to switch the two-state apparatus from the state of conduction to the state of non-conduction in response to an input signal to the blocking oscillator circuit; the blocking oscillator circuit comprising a transistor having a base, an emitter, and a collector; the emitter of the transistor being connected to one of said effective base electrodes; a transformer having a primary and a secondary winding, the primary winding being connected between the collector of the transistor and a source of predetermined potential, and the secondary winding being connected between the base of the transistor and a source of predetermined potential; a diode connected between the base of the transistor and through a series capacitor to an input connection; and a resistor connected in parallel with the diode.

7. An apparatus as claimed in claim 1, in which the semiconductor unit comprises a pair of complementary junction transistors; each of the complementary transistors including an emitter, a base, and a collector; the collector of each complementary transistor being connected to the base of the other complementary transistor, whereby the emitter of one complementary transistor forms the effective emitter electrode for said semiconductor unit, and the emitter of the other complementary transistor forms the effective collector electrode for said semiconductor unit; a third transistor having an emitter, a base, and a collector; the emitter of the third transistor being connected to one of said effective base electrodes; a transformer having a primary and a secondary winding, the primary winding being connected between the collector of the third transistor and a source of predetermined potential, and the secondary winding being connected between the base of the third transistor and a source of predetermined potential; a diode connected between the base of the third transistor and through a series capacitor to an input connection; and a resistor connected in parallel with the diode.

8. An apparatus as claimed in claim 1, in which a transistor is adapted to switch the semiconductor unit from the state of conduction to the state of non-conduction in response to an input signal; the transistor including an emitter connected to a source of predetermined potential, a base from which an input connection is taken through a series capacitor, and a collector connected to one of said effective base electrodes and connected through a series resistor to a source of predetermined potential; a bias resistor connected between the base of the transistor and a source of predetermined potential; a diode connected between the base and the emitter of the transistor, the diode being connected to pass current to the bias resistor to provide a cut-off bias for the transistor.

9. An apparatus as claimed in claim 1, in which a transistor is adapted to switch the semiconductor unit from the state of conduction to the state of non-conduction in response to an input signal; the transistor including an emitter connected to a source of predetermined potential, a base from which an input connection is taken through a series capacitor, and a collector connected through a series diode to one of said effective base electrodes and connected through a series resistor to a source of predetermined potential; a bias resistor connected between the base of the transistor and a source of predetermined potential; a diode connected between the base and the emitter of the transistor, the diode being connected to pass current to the bias resistor to provide a cut-off bias for the transistor.

10. An apparatus as claimed in claim 1, in which said effective emitter electrode is connected through two series diodes to a third source of predetermined potential, a resistor is connected from a fourth source of predetermined potential to a common point between the two diodes, whereby said effective emitter electrode is maintained at a substantially constant potential.

11. An apparatus as claimed in claim 1, in which a transistor is connected in an output circuit for the apparatus; the transistor having a base connected to said effective collector electrode, a collector connected to a source of predetermined potential, and an emitter from which an output connection is taken; a diode connected between the base and the emitter of the transistor, the diode being connected to pass current when the semiconductor unit is switched from the state of conduction to the state of non-conduction; whereby the transistor will rapidly discharge a capacitive load connected to the emitter of the transistor when the semiconductor unit switches from the state of conduction to the state of non-conduction.

12. An apparatus as claimed in claim 1, in which an input connection is taken from said effective emitter electrode through a series capacitor; a diode is connected between a source of predetermined potential and said effective emitter electrode to pass current when the semiconductor unit is in the state of conduction; a transistor is connected in an output circuit for the apparatus; the transistor having a base connected to said effective collector electrode, a collector connected to a source of predetermined potential, and an emitter from which an output connection is taken; a diode connected between the base and the emitter of the transistor, the diode being connected to pass current when the semiconductor unit is switched from the state of conduction to the state of non-conduction; whereby the transistor will rapidly discharge a capacitive load connected to the emitter of the transistor when the semiconductor unit switches from the state of conduction to the state of non-conduction.

13. An apparatus as claimed in claim 2, in which a blocking oscillator circuit is connected to one of said effective base electrodes and is adapted to switch the two-state apparatus from a state of conduction to a state of non-conduction in response to an input signal to the blocking oscillator circuit.

14. An apparatus as claimed in claim 2, in which an input connection is taken from said effective emitter electrode through a series capacitor, a diode is connected between a source of predetermined potential and said effective emitter electrode to pass current when the semiconductor unit is in the state of conduction, and a blocking oscillator circuit is connected to one of said effective base electrodes and is adapted to switch the two-state apparatus from the state of conduction to the state of non-conduction in response to an input signal to the blocking oscillator circuit.

15. An apparatus as claimed in claim 2 in which the means adapted to prevent the semiconductor unit from reaching a bottomed state is a series resistor connected from the collector of said other transistor to the base of said one transistor.

16. An apparatus as claimed in claim 2, in which a third transistor is adapted to switch the semiconductor unit from the state of conduction to the state of non-conduction in response to an input signal; the third transistor including an emitter connected to a source of predetermined potential, a base from which an input connection is taken through a series capacitor, and a collector connected to one of said effective base electrodes and connected through a series resistor to a source of predetermined potential; a bias resistor connected between the base of the third transistor and a source of predetermined potential; a diode connected between the base and the emitter of the third transistor, the diode being connected to pass current to the bias resistor to provide a cut-off bias for the third transistor.

17. An apparatus as claimed in claim 2, in which a third transistor is adapted to switch the semiconductor unit from the state of conduction to the state of non-conduction in response to an input signal; the third transistor including an emitter connected to a source of predetermined potential, a base from which an input connection is taken through a series capacitor, and a collector connected through a series diode to one of said effective base electrodes and connected through a series resistor to a source of predetermined potential; a bias resistor connected between the base of the third transistor and a source of predetermined potential; a diode connected between the base and the emitter of the third transistor, the diode being connected to pass current to the bias resistor to provide a cut-off bias for the third transistor.

18. An apparatus as claimed in claim 2, in which said effective emitter electrode is connected through two series diodes to a third source of predetermined potential, a resistor is connected from a fourth source of predetermined potential to a common point between the two diodes, whereby said effective emitter electrode is maintained at a substantially constant potential.

19. An apparatus as claimed in claim 2, in which a third transistor is connected in an output circuit for the apparatus; the third transistor having a base connected to said effective collector electrode, a collector connected to a source of predetermined potential, and an emitter from which an output connection is taken; a diode connected between the base and the emitter of the third transistor, the diode being connected to pass current when the semiconductor unit is switched from the state of conduction to the state of non-conduction; whereby the third transistor will rapidly discharge a capacitive load connected to the emitter of the third transistor when the semiconductor unit switches from the state of conduction to the state of non-conduction.

20. An apparatus as claimed in claim 2, in which an input connection is taken from said effective emitter electrode through a series capacitor, a diode is connected between a source of predetermined potential and said effective emitter electrode to pass current when the semi-conductor unit is in the state of conduction; a third transistor is connected in an output circuit for the apparatus; the third transistor having a base connected to said effective collector electrode, a collector connected to a source of predetermined potential, and an emitter from which an output connection is taken; a diode connected between the base and the emitter of the third transistor, the diode being connected to pass current when the semiconductor unit is switched from the state of conduction to the state of non-conduction; whereby the third transistor will rapidly discharge a capacitive load connected to the emitter of the third transistor when the semiconductor unit switches from the state of conduction to the state of non-conduction.

21. An apparatus as claimed in claim 2, in which an input signal at said input connection is substantially equal in magnitude to the output signal taken from said output connection; said apparatus comprising a first diode connected between said effective emitter electrode and a source of predetermined potential, the first diode being connected to be conductive when the semiconductor unit is in the state of conduction; a capacitor connected to said effective emitter electrode and through a second diode to said input connection; a resistor connected from said effective collector electrode to a common point between the capacitor and the second diode; a Zener diode connected from said effective collector electrode through a series resistor to a source of predetermined potential; a third transistor having a base connected to a common point between said Zener diode and said resistor, a collector connected to one of said effective base electrodes, and an emitter connected to a source of predetermined potential; the second diode being connected to be non-conductive when said effective collector electrode is clamped at said first predetermined potential; said Zener diode being adapted to maintain a constant potential difference between the base of the third transistor and said effective collector electrode, whereby a cut-off bias larger than said input signal appears between the base and the emitter of the third transistor when said effective collector electrode is clamped at said second predetermined potential, and a cut-off bias smaller than said input signal appears between the base and the emitter of the third transistor when said effective collector electrode is clamped at said first predetermined potential.

References Cited in the file of this patent

UNITED STATES PATENTS

| | | |
|---|---|---|
| 2,589,085 | Houghton | Mar. 11, 1952 |
| 2,655,609 | Shockley | Oct. 13, 1953 |
| 2,655,610 | Ebers | Oct. 13, 1953 |
| 2,724,061 | Emery | Nov. 15, 1955 |
| 2,758,206 | Hamilton | Aug. 7, 1956 |

FOREIGN PATENTS

| | | |
|---|---|---|
| 1,110,583 | France | Oct. 12, 1955 |

OTHER REFERENCES

"The Transistor Regenerative Amplifier as a Computer Element," by G. B. B. Chaplin, The Proceedings of the Institution of Elec. Eng., vol. 101, part III, No. 73, pages 298 to 307.